(12) United States Patent
Steeneken et al.

(10) Patent No.: US 8,680,690 B1
(45) Date of Patent: Mar. 25, 2014

(54) BOND WIRE ARRANGEMENT FOR EFFICIENT SIGNAL TRANSMISSION

(71) Applicant: NXP B.V., Eindhoven (NL)

(72) Inventors: Peter Steeneken, Valkenswaard (NL); Rameswor Shrestha, Eindhoven (NL); Martijn Bredius, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/708,117

(22) Filed: Dec. 7, 2012

(51) Int. Cl.
*H01L 23/49* (2006.01)
*H01L 23/66* (2006.01)

(52) U.S. Cl.
USPC .................... 257/784; 257/664; 257/E23.079

(58) Field of Classification Search
None
See application file for complete search history.

(56) References Cited

U.S. PATENT DOCUMENTS

| | | | |
|---|---|---|---|
| 3,273,033 A | 9/1966 | Rossmeisl |
| 4,292,595 A | 9/1981 | Smith |
| 4,748,419 A | 5/1988 | Somerville |
| 5,138,436 A | 8/1992 | Koepf |
| 5,187,636 A | 2/1993 | Nakao |
| 5,187,637 A | 2/1993 | Embree |
| 5,321,597 A | 6/1994 | Alacoque |
| 6,271,131 B1 | 8/2001 | Uhlenbrock |
| 6,331,999 B1 | 12/2001 | Ducaroir |
| 6,347,395 B1 | 2/2002 | Payne |
| 6,429,735 B1 | 8/2002 | Kuo |
| 6,507,226 B2 | 1/2003 | Swonger |
| 6,636,166 B2 | 10/2003 | Sessions |
| 6,664,859 B1 | 12/2003 | Chen |
| 6,809,569 B2 | 10/2004 | Wang |
| 6,839,862 B2 | 1/2005 | Evoy |
| 6,859,883 B2 | 2/2005 | Svestka |
| 6,882,046 B2 | 4/2005 | Davenport |
| 6,920,576 B2 | 7/2005 | Ehmann |
| 6,992,377 B2 | 1/2006 | Zhou et al. |
| 7,199,617 B1 | 4/2007 | Schrom |
| 7,302,247 B2 | 11/2007 | Dupuis |

(Continued)

FOREIGN PATENT DOCUMENTS

| | | |
|---|---|---|
| EP | 1291918 A2 | 3/2003 |
| EP | 1564884 A1 | 8/2005 |
| GB | 2204467 A | 11/1988 |

OTHER PUBLICATIONS

Qi, Xiaoning. High Frequency Characterization and Modeling of On-Chip Interconnects and RF IC Wire Bonds. Diss. Stanford University, 2001. Stanford: Department of Electrical Engineering, 2001.*

(Continued)

*Primary Examiner* — Thomas L Dickey
*Assistant Examiner* — Joseph Schoenholtz

(57) ABSTRACT

In one embodiment, a device includes a first IC having a differential signal driver and a first isolation circuit configured to provide differential signals transmitted by the differential signal driver to a first pair of bond pads of the first IC. First and second bond wires are configured to provide differential signals from the first pair of bond pads to a second pair of bond pad included in a second IC. The second IC includes a second isolation circuit configured to provide differential signals from the second pair of bond pads to a differential receiver circuit of the second IC. The bond wires are specifically arranged such that a distance between the first and second bond wires varies by at least 10% as measured at two points along a length of the first bond wire.

20 Claims, 7 Drawing Sheets

(56) References Cited

U.S. PATENT DOCUMENTS

| | | | |
|---|---|---|---|
| 7,376,212 | B2 | 5/2008 | Dupuis |
| 7,400,173 | B1 | 7/2008 | Kwong |
| 7,411,421 | B1 | 8/2008 | Steinke |
| 7,421,028 | B2 | 9/2008 | Dupuis |
| 7,447,492 | B2 | 11/2008 | Dupuis |
| 7,460,604 | B2 | 12/2008 | Dupuis |
| 7,577,223 | B2 | 8/2009 | Alfano et al. |
| 7,650,130 | B2 | 1/2010 | Dupuis |
| 7,732,889 | B2 | 6/2010 | Crawley |
| 7,737,871 | B2 | 6/2010 | Leung et al. |
| 7,738,568 | B2 | 6/2010 | Alfano et al. |
| 7,755,400 | B2 | 7/2010 | Jordanger et al. |
| 7,821,428 | B2 | 10/2010 | Leung et al. |
| 7,856,219 | B2 | 12/2010 | Dupuis |
| 7,902,627 | B2 | 3/2011 | Dong et al. |
| 7,986,184 | B2 * | 7/2011 | Besling et al. ............ 330/67 |
| 8,049,573 | B2 | 11/2011 | Alfano et al. |
| 8,064,872 | B2 | 11/2011 | Dupuis |
| 8,169,108 | B2 | 5/2012 | Dupuis et al. |
| 8,284,823 | B2 | 10/2012 | Breitfuss |
| 8,436,450 | B2 * | 5/2013 | Menon ................ 257/664 |
| 2001/0052623 | A1 | 12/2001 | Kameyama |
| 2002/0021144 | A1 | 2/2002 | Morgan |
| 2002/0184544 | A1 | 12/2002 | Svestka et al. |
| 2002/0186058 | A1 | 12/2002 | Prodanov |
| 2003/0214346 | A1 | 11/2003 | Pelliconi |
| 2004/0076192 | A1 | 4/2004 | Zerbe |
| 2004/0159893 | A1 | 8/2004 | Kitahara |
| 2004/0161068 | A1 | 8/2004 | Zerbe |
| 2005/0127452 | A1 | 6/2005 | Rippke |
| 2005/0174156 | A1 | 8/2005 | Wu |
| 2006/0138595 | A1 | 6/2006 | Kiyotoshi |
| 2007/0075784 | A1 | 4/2007 | Pettersson |
| 2008/0051158 | A1 * | 2/2008 | Male et al. ............ 455/572 |
| 2008/0174360 | A1 | 7/2008 | Hsu |
| 2008/0290444 | A1 | 11/2008 | Crawley |
| 2009/0146760 | A1 | 6/2009 | Reefman |
| 2009/0213914 | A1 * | 8/2009 | Dong et al. ............ 375/219 |
| 2009/0237858 | A1 | 9/2009 | Steeneken |
| 2010/0052826 | A1 | 3/2010 | Callahan et al. |
| 2010/0118918 | A1 | 5/2010 | Dupuis |
| 2010/0327940 | A1 | 12/2010 | Eisenstadt |
| 2011/0006814 | A1 | 1/2011 | Acar |
| 2012/0262231 | A1 * | 10/2012 | Scandiuzzo et al. ......... 330/69 |
| 2013/0154071 | A1 * | 6/2013 | Haigh et al. ............ 257/670 |
| 2013/0207687 | A1 * | 8/2013 | Honda et al. ............ 326/30 |
| 2013/0257527 | A1 * | 10/2013 | Dong ................ 327/565 |
| 2013/0279549 | A1 * | 10/2013 | Van de Beek .......... 375/219 |
| 2013/0301690 | A1 * | 11/2013 | Shrestha ............ 375/219 |

OTHER PUBLICATIONS

Mandhana, O.P.; Jin Zhao, "Layout parameter optimization based power and signal integrity performance improvement of high-speed interfaces of wirebond packages," Electronic Components and Technology Conference (ECTC), 2013 IEEE 63rd , vol., No., pp. 2107,2112, May 28-31, 2013.*

Zwitter, D.; Nanju Na; Arseneault, M.; Yonehara, K.; Haitian Hu; Bailey, M.; Cannon, T., "Competitiveness and Technical Challenges of Low Cost Wirebond Packaging for High Speed SerDes Applications in ASICs," Electronic Components and Technology Conference, 2007. ECTC '07. Proceedings. 57th , vol., No., pp. 777,784, May 29-Jun. 1, 2007.*

Greg Smith, "Hybrid Isolation Amps Zap Price and Voltage Barriers" Electronic Design, Dec. 11, 1986.

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 BUS", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on ,vol. 2 , Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

LANTRONIX, Xpress-DR+Wireless, Datasheet, LANTRONIX, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator CMOS: Testing and Applications", Analog Integr. Circ. Sig. Process, Jun. 27, 2006.

Inoue, A., et al "A high efficiency, high voltage, balanced cascode FET", IEEE International Microwave Symposium, Jun. 1995.

S. M. Sze, "Semiconductor Devices Physics and Technology", 2nd Edition, John Wiley and Sons, Inc., pp. 493-494 and 503-507, 1985, 2002.

Burr Brown, ISO 103, Low Cost, Internally Powered Isolation Amplifier, IC Publication Datasheet, Burr Brown Corporation, 1989.

Stephen Mick, et al., "Packaging Technology for AC Coupled Interconnection", IEEE Flip-Chip Conference, 2002.

Abedinpour S., Bakkoglu B., with Integrated Output Filter in 0.18 m SiGe Process, IEEE Kiaei S., A Multistage Interleaved Synchronous Buck Converter Transactions on Power Electronics, vol. 22, No. 6, Nov. 2007.

Aoki I., Kee S., Magoon R., Aparicio R., Bohn F., Zachan J., Hatcher G., McClymont D., Hajimiri A., "A Fully Integrated Quad-Band GSM/GPRS CMOS Power Amplifier", International Solid-State Circuits Conference, 2007.

Kursun V., Narendra S.G., De V.K., Friedman E.G., "High input voltage step-down DC-DC converters for integration in a low voltage CMOS process", Quality Electronic Design, 2004.

Rocha J., Santos M., Dores Costa J.M., Lima F., "High Voltage Tolerant Level Shifters and DCVSL in Standard Low Voltage CMOS Technologies", IEEE, 2007.

Sonsky J., Heringa A., Perez-Gonzalez J., Benson J., Chiang P.Y., Bardy S., Volokhine I."Innovative High Voltage transistors for complex HV/RF SoCs in baseline CMOS", IEEE, 2008.

* cited by examiner

BOND WIRE ARRANGEMENT FOR EFFICIENT SIGNAL TRANSMISSION

Aspects of the present disclosure relate to apparatuses, devices, and methods involving communication between integrated circuits.

Electronic devices can be constructed using multiple integrated circuits (IC), which can be located within the same package or in different packages. Bond pads, located on top of the ICs, provide electrical connections to circuits of the ICs. During operation of such a device, signals are communicated between the ICs using bond wires, which provide electrical connections between bond pads of the ICs. Bond wires are oriented such that the bond wires follow paths between the ICs that are parallel to one another and implemented to have the shortest possible length. In general, the parallel arrangement of bond wires reduces the amount of material required to implement the bond wires, and thereby, reduces manufacturing costs. Moreover, arranging bond wires in parallel can be useful for providing a reduced resistance and inductance, while keeping these values substantially equal between the bond wires.

For ease of explanation, paths of bond wires may be described with reference to X, Y, and Z dimensions, where an X-Z plane is parallel to a top surface of the ICs and the Y dimension is perpendicular to the X-Z plane. Each bond wire follows a respective path between the first and second ICs that has a height described by the function $y=h(t)$, where t is a distance along the length of a bond wire relative to an end of the bond wire. For ease of reference, the height function $h(t)$ of a bond wire may be referred to as a height profile.

As used herein, a distance between the first and second bond wires at a point along the length of the first bond wire refers to the shortest distance from the point of the first bond wire to the second bond wire. As used herein, first and second bond wires may be referred to as parallel where the distance between the first and second bond wires is the same for every point t along the length of the first bond wire. The capacitance between a first bond wire and a second bond wire may be represented by the difference between the relative heights $h(t)$ of the bond wires. As used herein, the distance between the bond wires along their entire lengths, as it relates to capacitance between the bond wires, may be referred to as the effective distance of the bond wires. For instance, an approximation of the effective distance can be determined by calculating the capacitance between the two bond wires (e.g., using Laplace's equation), and determining a distance between two straight parallel wires that would also provide the same determined capacitance, assuming all other relevant aspects remain the same (e.g., the bond wires have the same length and radius).

Aspects of the present disclosure relate generally to apparatuses, devices, and methods relating to the applications discussed above. In one or more embodiments, the circuits of different ICs communicate over capacitive-coupled bond wires.

According to an example embodiment, a device configured for communication between first and second galvanically isolated ICs is provided. The first IC is configured to communicate differential signals to the second IC over first and second bond wires. The first and second bond wires connect a first pair of bond pads on the first IC to a second pair of bond pads on the second IC. The first and second bond wires are arranged to reduce parasitic capacitances between the first and second bond wires by increasing the distance between the bond wires relative to a parallel arrangement of the bond wires. In some implementations, the first and second bond wires are specifically arranged such that a distance between the first and second bond wires varies by at least 10% as measured at two points along a length of the first bond wire.

The first IC includes a first differential signal driver circuit configured to transmit a first differential signal. The first IC includes a first isolation circuit configured to receive the first differential signal and to produce a second version of the first differential signal that is isolated from the first differential signal driver circuit. The first pair of bond pads on the first IC is coupled to receive the second version of the first differential signal. The second pair of bond pads of the second IC is configured to receive the second version of the first differential signal. The second IC includes a second isolation circuit configured to receive the second version of the first differential signal from the second pair of bond pads and produce a third version of the first differential signal that is isolated from the second pair of bond pads. The second IC includes a first differential signal receiver circuit configured to receive the third version of a first differential signal. The first and second bond wires each form an electrical connection between a respective one of the first pair of bond pads and a respective one of the second pair of bond pads. As indicated above, the first and second bond wires are specifically arranged such that a distance between the first and second bond wires varies by at least 10%, as measured at two points along a length of the first bond wire.

In another embodiment, a device uses differential signaling for bi-directional communication between first and second isolated ICs over four bond wires. The first and second bond wires are used for transmitting differential signals from the first IC to the second IC. The third and fourth bond wires are used for transmitting differential signals from the second IC to the first IC. The second bond wire is adjacent to the third bond wire. The device includes a balancing circuit configured to balance capacitances of the bond wires. In one implementation, the balancing circuit is configured to provide a capacitance between the first and fourth bond wires that is substantially equal to a parasitic capacitance between the second and third bond wires.

The first IC of the device includes a first differential signal driver circuit, a first differential receiver circuit, and first, second, third, and fourth bond pads. The first IC also includes first and second isolation circuits. The first isolation circuit is configured to provide differential signals from first and second outputs of the first differential signal driver circuit to the first and second bond pads and to provide isolation between the first differential signal driver circuit and the first and second bond pads. The second isolation circuit is configured to provide differential signals from the third and fourth bond pads to first and second inputs of the first receiver circuit and provide isolation between the first differential receiver circuit and the third and fourth bond pads. The first, second, third, and fourth bond wires of the device are respectively coupled to the first, second, third, and fourth bond pads. The second bond wire is adjacent to the third bond wire.

The second IC of the device includes a second differential signal driver circuit and a second differential receiver circuit. The second IC also includes fifth, sixth, seventh, and eighth bond pads respectively coupled to the first, second, third, and fourth bond wires. The second IC also includes third and fourth isolation circuits. The third isolation circuit is configured to provide differential signals from the fifth and sixth bond pads to first and second inputs of the second differential receiver circuit and provide isolation between the second differential receiver circuit and the fifth and sixth bond pads. The fourth isolation circuit is configured to provide differential signals from the first and second outputs of the second differential signal driver circuit to the seventh and eights bond pads and provide isolation between the second differential signal driver circuit and the seventh and eighth bond pads.

In yet another embodiment, a method is provided for the manufacture of a device that communicates differential signals between first and second ICs, which operate in respective voltage domains, over a pair of bond wires. First and second bond wires of the pair of bond wires are manufactured. Each of the first and second bond wires have a respective height profile along a line extending between first and second ends of the bond wire. The first bond wire is placed to have a first end of the bond wire coupled to a first bond pad located on the first IC and a second end of the bond wire coupled to a first bond pad located on the second IC. The second bond wire is placed to have a first end of the bond wire coupled to a third bond pad located on the first IC and a second end of the bond wire coupled to a fourth bond pad located on the second IC. The placement of the first and second bond wires orients the bond wires such that a distance between the first and second bond wires varies by at least 10% as measured at two points along a length of the first bond wire.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 8:
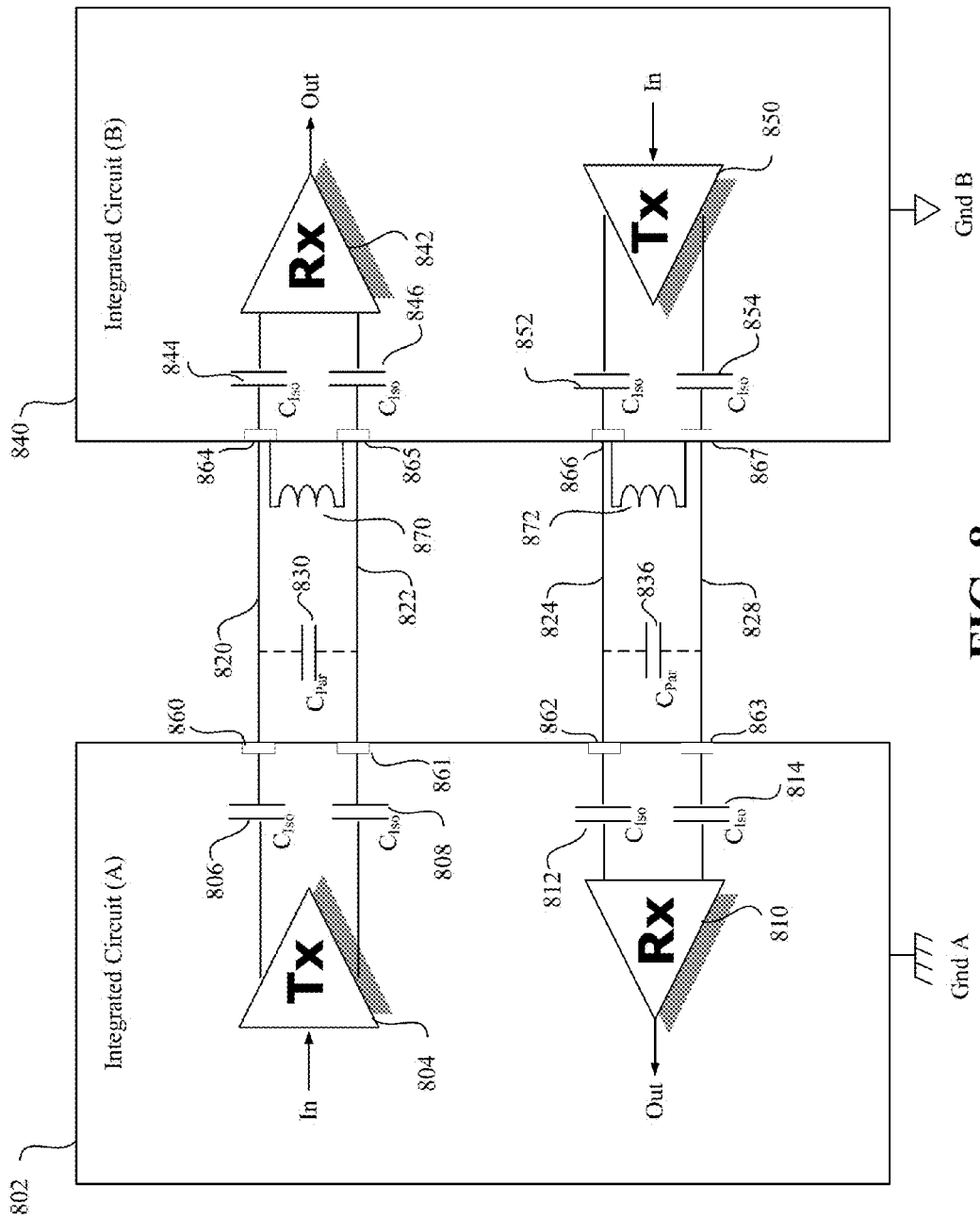
Figure 9:
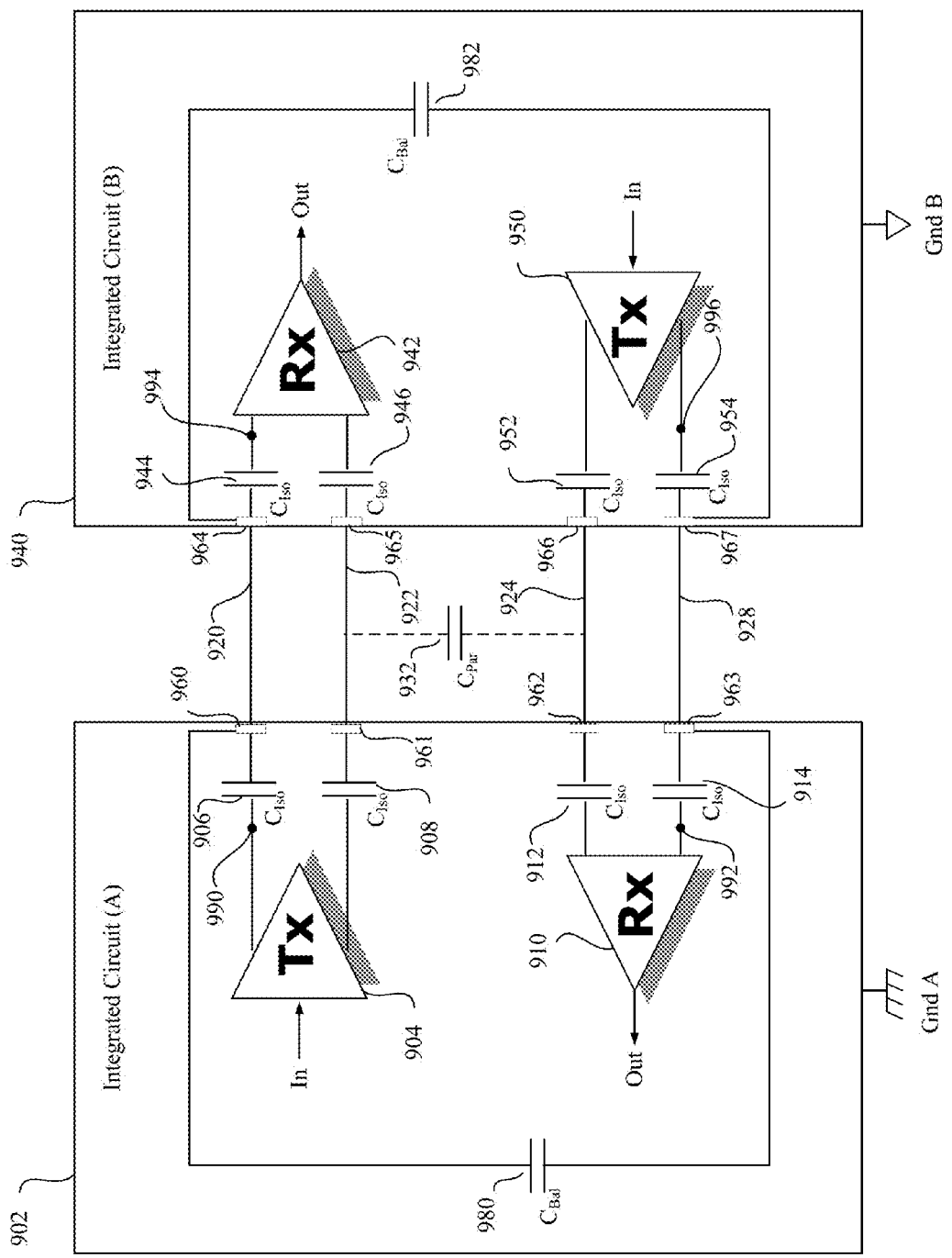

FIG. 8 shows a system for bi-directional communication between two ICs having inductors connected to reduce mutual capacitance of bond wires, consistent with embodiments of the present disclosure; and FIG. 9 shows a system for bi-directional communication between two ICs having a balancing circuit connected to balance mutual capacitances of bond wires, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving transmission of signals between ICs using capacitive-coupled bond wires. While not necessarily so limited, various aspects may be appreciated through a discussion of examples using this context.

Various example embodiments are directed to transmission of data between circuits that are galvanically isolated from each other. For instance, in some applications, galvanic isolation is provided between two ICs by capacitively coupling bond pads to circuits of the ICs with isolation capacitors and transmitting signals over bond wires coupled to the bond pads using differential signaling. In some other applications, galvanic isolation is provided between two ICs by inductively coupling a bond pad to circuits of the ICs with isolation capacitors and signals are transmitted over the bond wires coupled to the bond pad using differential signaling. Differential signaling translates a data signal into a pair of out-of-phase signals that are transmitted on respective bond wires connecting two ICs. A receiving IC recovers the signal as a difference in voltages on the two conductive lines. The differentially transmitted signals can be modulated in a number of different manners in order to convey data. The capacitive coupling on each bond wire acts as a means of blocking DC voltages and attenuating low-frequency signals while transmitting high-frequency signals. Due to the capacitive coupling at each end of the bond wires, the bond wires have respective floating voltage potentials. Although the embodiments are not so limited, for ease of explanation, the disclosed examples are primarily described with reference to galvanic isolation using capacitive coupling.

It has been discovered in connection with the instant application that in some applications, in which bond wires have respective floating voltage potentials, small parasitic capacitances between adjacent bond wires can significantly degrade transmission of high-frequency signals (e.g., frequencies above 700 MHz). For instance, if the parasitic capacitance between the bond wires is of the same order of magnitude as capacitance of the capacitors used for galvanic isolation, the parasitic capacitance provides a 'signal leakage path' having an impedance similar to that of the intended signal path to a receiver. As a result, a significant part of the signal is removed via this leakage path and the signal transmitted to the receiver is reduced. When designing circuits that communicate using differential signaling carried on pairs of bond wires, it can be desirable to use bond wires with short lengths (e.g., relative to inductance of the bond wires) and that are arranged in parallel. Aspects of the present disclosure, however, recognize that bond wires that deviate from such traits can be beneficial in certain applications.

In one or more embodiments, multiple ICs are connected by galvanically isolated bond wires that are oriented to mitigate parasitic capacitance between adjacent ones of the bond wires. Parasitic capacitance between two bond wires refers to the mutual capacitance between the bond wires and such terms may be used interchangeably herein. In some embodiments, bond wires are oriented to reduce parasitic capacitance between adjacent bond wires by increasing the effective distance between the bond wires relative to a parallel arrangement of bond wires.

In an example embodiment, a device includes a first IC having a differential signal driver and a first isolation circuit that is configured to provide differential signals transmitted by the differential signal driver to a first pair of bond pads of the first IC. First and second bond wires are configured to provide differential signals from the first pair of bond pads to a second pair of bond pads included in a second IC. The second IC includes a second isolation circuit that is configured to provide differential signals from the second pair of bond pads to a differential receiver circuit of the second IC.

The first and second bond wires are arranged to reduce parasitic capacitances between the first and second bond wires by increasing the effective distance between the bond wires with reference to a parallel arrangement of bond wires. In some embodiments, the first and second bond wires are specifically arranged such that a distance between the first and second bond wires varies by at least 10% as measured at two points (e.g., $t_1$ and $t_2$) along a length of the first bond wire.

In some embodiments, effective distance between the first and second bond wires is increased relative to a parallel arrangement of the bond wires by orienting the bond wires to have different height profiles between the first pair of bond pads and the second pair of bond pads. In some embodiments, capacitance between two bond wires is reduced, relative to the parallel arrangement, by orienting the bond wires such that a distance between the wires increases at every point t along the length of one of the two bond wires. In some embodiments, the first and second bond wires are positioned at different heights above one or both of the pairs of bond pads. In some embodiments, the first and second bond wires have different lengths. For instance, in one implementation, the first bond wire is shorter than the second bond wire. The first bond wire has a height profile that is less than a height profile of the second bond wire.

In some embodiments, the lengths of the first and second bond wires are substantially equal. In one implementation, the first bond wire is oriented to have a height profile $h_1(t)$ that is the reverse of a height profile $h_2(t)$ of second bond wire. For instance, for first and second bond wires having lengths s, each point t along the length of the first bond wire has a height that is substantially equal to a height of the second bond wire at each point s-t along the length of the second bond wire (i.e., $h_1(t)=h_2(s-t)$), where t is equal to zero at a common IC for both bond wires.

In some embodiments, the parasitic capacitance between the first and second bond wires is alternatively or additionally reduced by increasing lateral distances between bond pads (i.e. difference of positions of bond pads in the z-dimension) of each of the first and second pairs of bond pads to increase the lateral distance between the first and second bond wires (i.e., z-dimension component of distance between the bond wires). In one embodiment, bond pads of the first pair of bond pads are separated by a distance that is greater than a distance between the second pair of bond pads.

In some embodiments, the parasitic capacitance between the first and second bond wires is alternatively or additionally reduced by decreasing the radius of the bond wires. In one implementation, the bond pads of each of the first and second pair of bond pads are separated by a lateral distance (i.e., in the Z dimension) that is less than 10 times a radius of the bond wires. In some embodiments, the parasitic capacitance between the first and second bond wires is alternatively or additionally reduced by reducing the length of the first and second bond wires. In some embodiments, the parasitic capacitance between the first and second bond wires is alternatively or additionally reduced by decreasing the dielectric constant of a molding compound that surrounds the bond wires.

In some embodiments, parasitic capacitance between the first and second bond wires is mitigated by an inductor having a first end coupled to the first bond wire and a second end coupled to the second bond wire. In some implementations, the inductance L, $$L \approx 1/[C^*(2\pi F)^2],$$

where F is the frequency of a differential signal transmitted over the bond wires and C is the mutual capacitance of the bond wires without the inductor connected. This formula can be modified according to the specific circuit design. For instance, the formula can be modified to account for the isolation capacitors being located between the inductor and the bond pads and bond wires.

In some embodiments, the first and second isolation circuits are configured to provide capacitive coupling between the differential signal driver and differential receiver circuits and the respective first and second pairs of bond pads. In one embodiment, the first isolation circuit, which provides the differential signals transmitted by the differential signal driver circuit to the first pair of bond pads of the first IC, includes first and second isolation capacitors. The isolation capacitors capacitively isolate the differential signal driver from each of the respective bond wires. For instance, the first isolation capacitor can have a first capacitive plate coupled to a first output of the first differential signal driver circuit and a second capacitive plate coupled to a first one of the first pair of bond pads. The second isolation capacitor can have a first capacitive plate coupled to a second output of the first differential signal driver circuit and a second capacitive plate coupled to a second one of the first pair of bond pads. Similarly, the second isolation circuit, which provides the differential signals from the second pair of bond pads to the differential receiver circuit, includes third and fourth isolation capacitors. The third isolation capacitor can have a first plate coupled to a first one of the second pair of the bond pads and a second capacitive plate coupled to a first input of the differential receiver circuit. The fourth isolation capacitor can have a first capacitive plate coupled to a second one of the second pair of bond pads and a second capacitive plate coupled to a second input of the differential receiver circuit.

In some embodiments, the first, second, third, and fourth isolation capacitors have respective capacitances of less than 100 fF. In some embodiments, the first, second, third, and fourth isolation capacitors have respective capacitances approximately equal to 50 fF. In some embodiments, the first, second, third, and fourth isolation capacitors each have a dielectric made of silicon oxide. In some embodiments, the dielectric of the first, second, third, and fourth isolation capacitors is thicker than 4 μm.

In some embodiments, a device uses differential signaling for bi-directional communication between first and second isolated ICs over four bond wires. The first and second bond wires are used for transmitting differential signals from the first IC to the second IC. The third and fourth bond wires are used for transmitting differential signals from the second IC to the first IC. The second bond wire is adjacent to the third bond wire. Due to parasitic capacitances between the second and third bond wires, the differential channels provided by the pairs of bond wires may become unbalanced. As a result, common mode immunity of the channels may become degraded. In some embodiments, the device includes a balancing circuit that is configured to balance capacitances between the bond wires. The balancing circuit is configured to provide a capacitance between the first and fourth bond wires that counter balances a parasitic capacitance between the second and third bond wires. This can include setting the capacitance value of the provided capacitor to be substantially equal to a capacitance of the parasitic capacitance. For instance, the capacitive values can be matched to within an expected tolerance and/or variation of capacitance values for each of the two capacitances.

In some embodiments, a method is provided for the manufacture of a device that communicates differential signals between first and second ICs, which operate in respective voltage domains, over a pair of bond wires. The first and second bond wires of the pair of bond wires are manufactured. Each of the first and second bond wires has a respective height profile along the length of the respective bond wire. The first bond wire is placed to have a first end of the bond wire coupled to a first bond pad located on the first IC and a second end of the bond wire coupled to a first bond pad located on the second IC. The second bond wire is placed to have a first end of the bond wire coupled to a third bond pad located on the first IC and a second end of the bond wire coupled to a fourth bond pad located on the second IC. The placement of the first and second bond wires orients the bond wires such that a distance between the first and second bond wires varies by at least 10% as measured at two points (e.g., $t_1$ and $t_2$) along a length of the first bond wire.

Figure 1:
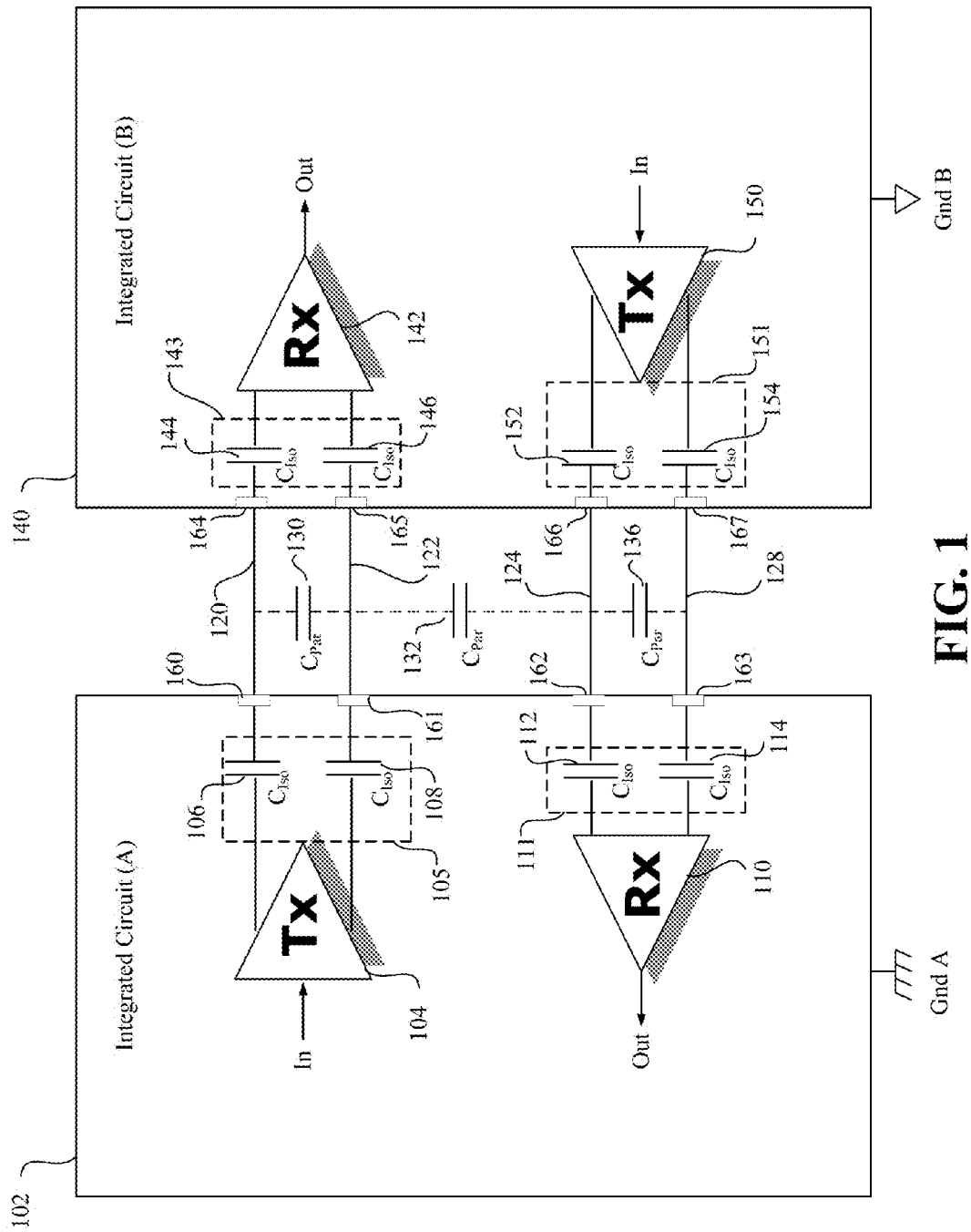
FIG. 1 shows a system for bi-directional communication between two ICs, consistent with embodiments of the present disclosure.

Turning now to the figures, FIG. 1 shows a system for bi-directional communication between two ICs, consistent with embodiments of the present disclosure. The system includes first and second ICs 102 and 140 that are configured for bi-directional communication over bond wires 120, 122, 124, and 128. In this example, each of the bond wires capacitively couples IC 102 and IC 140. The first IC 102 includes a transmitter circuit 104, which is configured to transmit differential signals over bond wires 120 and 122, and a receiver circuit 110, which is configured to receive a differential signal transmitted over bond wires 124 and 128. Similarly, the second IC 140 includes a receiver circuit 142 that is configured to receive a differential signal transmitted over bond wires 120 and 122, and a transmitter circuit 150 that is configured to transmit signal data over bond wires 124 and 128.

The bond wires 120, 122, 124, and 128 are respectively coupled to bond pads 160, 161, 162, and 163 of IC 102 and respectively coupled to bond pads 164, 165, 166, and 167 of IC 140. IC 102 includes a first isolation circuit 105 that is configured to provide signals transmitted from transmitter circuit 104 to bond pads 160 and 161. IC 102 also includes a second isolation circuit 111 that is configured to provide signals from bond pads 162 and 163 to inputs of receiver circuit 110. Similarly, IC 140 includes a third isolation circuit 143 that is configured to provide signals transmitted from bond pads 164 and 165 to inputs of receiver circuit 142. IC 140 also includes a fourth isolation circuit 151 that is configured to provide signals from transmitter circuit 150 to bond pads 166 and 167.

As shown in FIG. 1, in some embodiments, the isolation circuits capacitively couple pairs of bond pads to respective transmitter/receiver circuits. In one implementation, the first isolation circuit 105 includes isolation capacitors 106 and 108 having first plates coupled to respective bond pads 160 and 161 and having second plates coupled to respective outputs of the transmitter circuit 104. The second isolation circuit 111 includes isolation capacitors 112 and 114 having first plates coupled to respective bond pads 162 and 163 and having second plates coupled to respective inputs of the receiver circuit 110. The third isolation circuit 143 includes isolation capacitors 144 and 146 having first plates coupled to respective bond pads 164 and 165 and having second plates coupled to respective inputs of the receiver circuit 142. The fourth isolation circuit 151 includes isolation capacitors 152 and 154 having first plates coupled to respective bond pads 166 and 167 and having second plates coupled to respective outputs of the transmitter circuit 150.

In some implantations, the isolation capacitors 106, 108, 112, 114, 144, 146, 152, and 154 each provide a small capacitance (e.g., <100 fF) to provide galvanic isolation of the bond pads from the transmitter/receiver circuits. In one implementation, each isolation capacitor has a capacitance of 50 fF. The isolation capacitors 106, 108, 112, 114, 144, 146, 152, and 154 may be implemented using various dielectric materials and capacitive structures alone or in combination. In some embodiments, the isolation capacitors 106, 108, 112, 114, 144, 146, 152, and 154 each have a dielectric made of silicon oxide. In some embodiments, the dielectric of the isolation capacitors is thicker than 4 μm.

Adjacent ones of the bond wires are subject to parasitic capacitances (e.g., 130, 132, and 136). As indicated above, such parasitic capacitances can degrade transmission of high-frequency signals transmitted over the galvanically isolated bond wires. In some embodiments, bond wires are oriented to reduced parasitic capacitance between adjacent bond wires by increasing an effective distance between the bond wires relative to a parallel orientation of bond wires between the bond pads.

Figure 2:
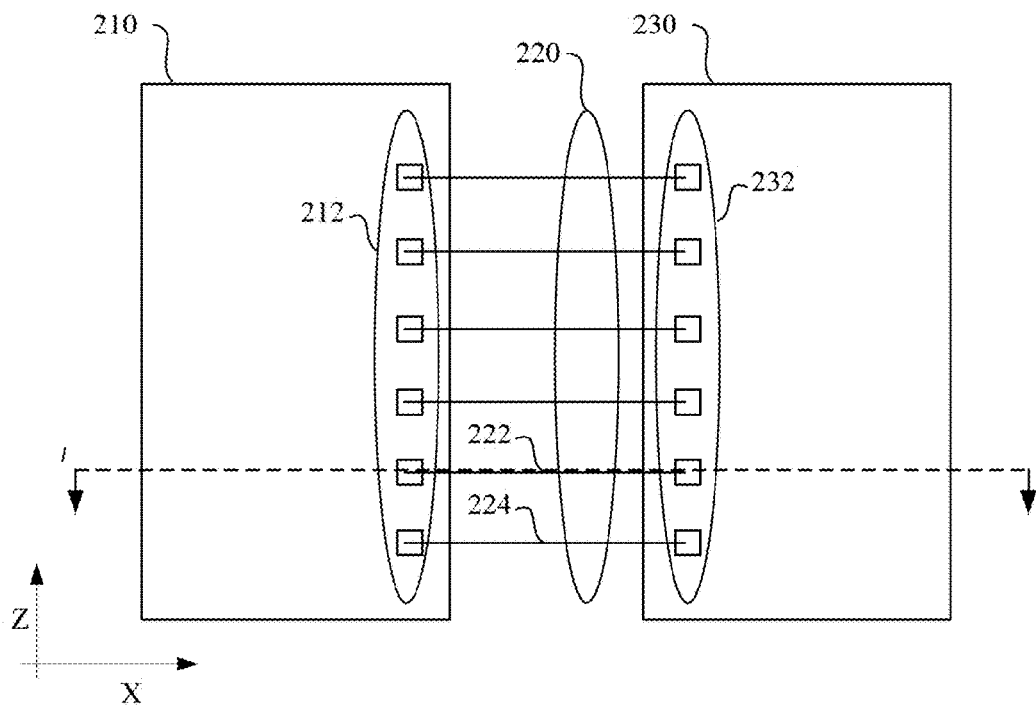
FIG. 2 shows a top view of two ICs connected with bond wires in a first arrangement, consistent with embodiments of the present disclosure.
Figure 3:
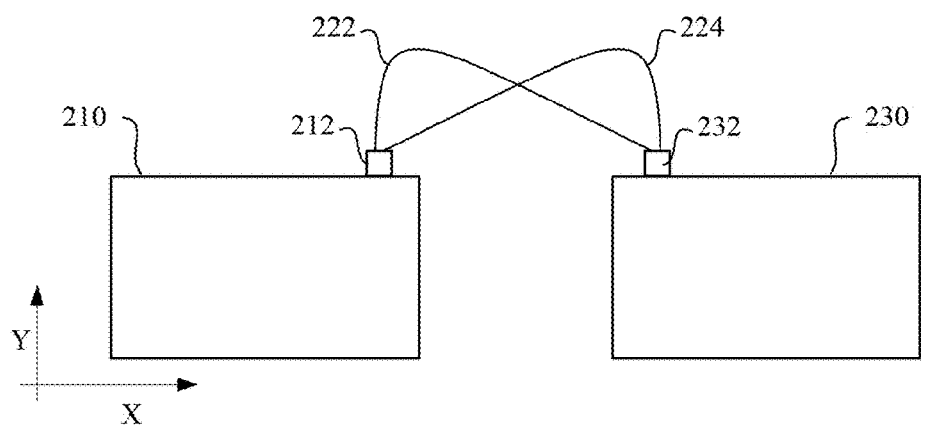
FIG. 3 shows a cross-section view of two ICs connected with bond wires in the first arrangement, consistent with embodiments of the present disclosure.

FIGS. 2 and 3 show top and cross-section views of two ICs connected with bond wires in a first arrangement that is configured to increase effective distances of adjacent bond wires, consistent with embodiments of the present disclosure. FIG. 2 shows a top view of first and second ICs connected by a set of bond wires. Each of the first and second ICs 210 and 230 include a respective set of bond pads 212 and 232, which provide electrical connections to circuits of the ICs. Bond wires 220 connect respective bond pads 212 on the first IC 210 to respective bond pads 232 on the second IC 230. FIG. 3 shows cross section I of the ICs and bond wires shown in FIG. 2. The cross section shows a height profile $h_1(t)$ of a first bond wire 222 and a height profile $h_2(t)$ of a second bond wire 224 between the first and second ICs 210 and 230. In this instance, the first bond wire 222 has a height profile $h_1(t)$ that is the reverse of a height profile $h_2(t)$ of second bond wire 224. For instance, each point t along the length of the first bond wire 222 has a height that is substantially equal to a height of the second bond wire 224 at each point s-t along the length of the second bond wire (i.e., $h_1(t)=h_2(s-t)$), where s is a length of the bond wires. As a result of the different height profiles of bond wires 222 and 224, the effective distance between the adjacent bond wires 222 and 224 is increased relative to a parallel arrangement of the bond wires. In this manner, capacitance of adjacent bond wires is reduced relative to the parallel arrangement of bond wires.

Figure 4:
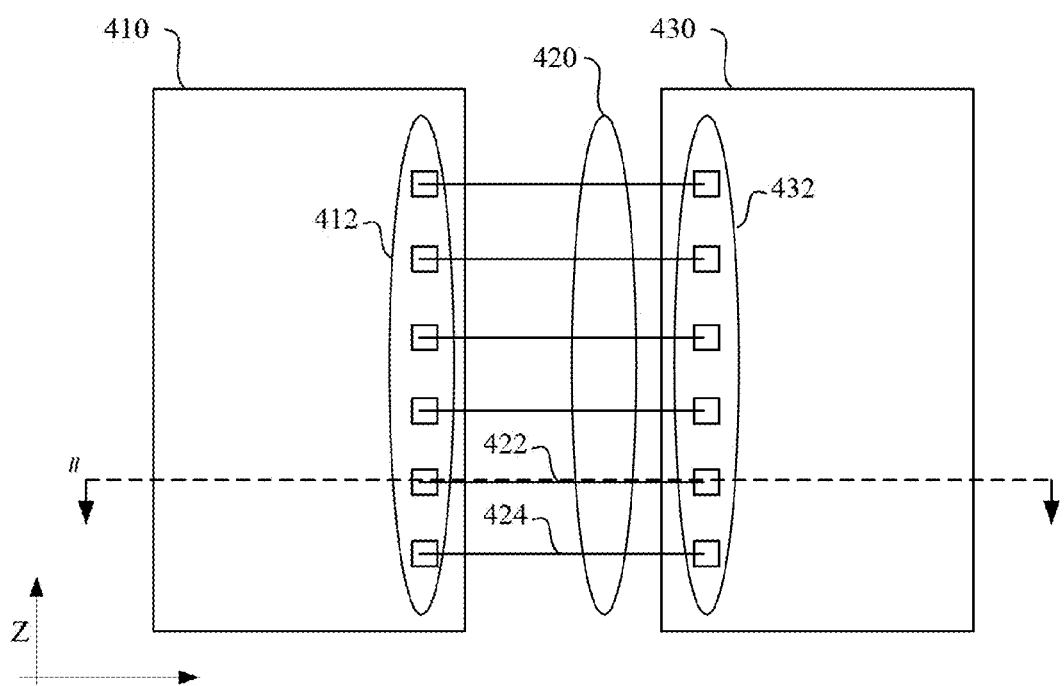
FIG. 4 shows a top view of two ICs connected with bond wires in a second arrangement, consistent with embodiments of the present disclosure.
Figure 5:
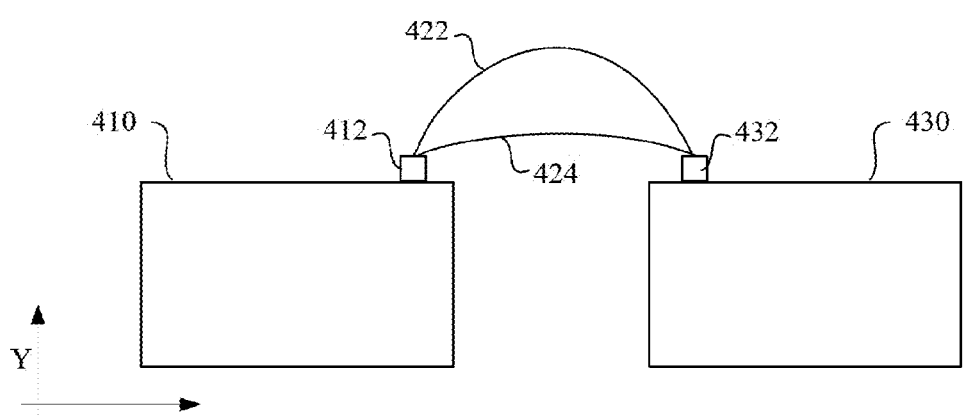
FIG. 5 shows a cross-section view of two ICs connected with bond wires in the second arrangement, consistent with embodiments of the present disclosure.

FIGS. 4 and 5 show top and cross-section views of two ICs connected with bond wires in a second arrangement that is configured to increase effective distance of adjacent bond wires, consistent with embodiments of the present disclosure. FIG. 4 shows a top view of first and second ICs connected by a set of bond wires. Each of the first and second ICs 410 and 430 include a respective set of bond pads 412 and 432, which provide electrical connections to circuits of the ICs. Bond wires 420 connect respective bond pads 412 on the first IC 410 to respective bond pads 432 on the second IC 430. FIG. 5 shows cross section II of the ICs and bond wires shown in FIG. 4. The cross section shows height profiles of first and second bond wires 422 and 424 between the first and second ICs 210 and 230. In this instance, adjacent bond wires 422 and 424 have different lengths to give the wires different height profiles. The first bond wire 422 has a longer length than the second bond wire 424. As such, the first bond wire 422 is oriented between ICs 410 and 430 at a height profile that is greater than a height profile of the second bond wire 424 for each respective point in the x-dimension. As a result, capacitance of an arrangement of adjacent bond wires is reduced relative to a parallel arrangement of adjacent bond wires.

Other arrangements of the bond wires are also possible to increase effective distance of the bond wires using different height profiles. In some embodiments, capacitance may be alternatively or additionally reduced by increasing lateral distance (i.e., z-dimensional component of distances between bond wires).

Figure 6:
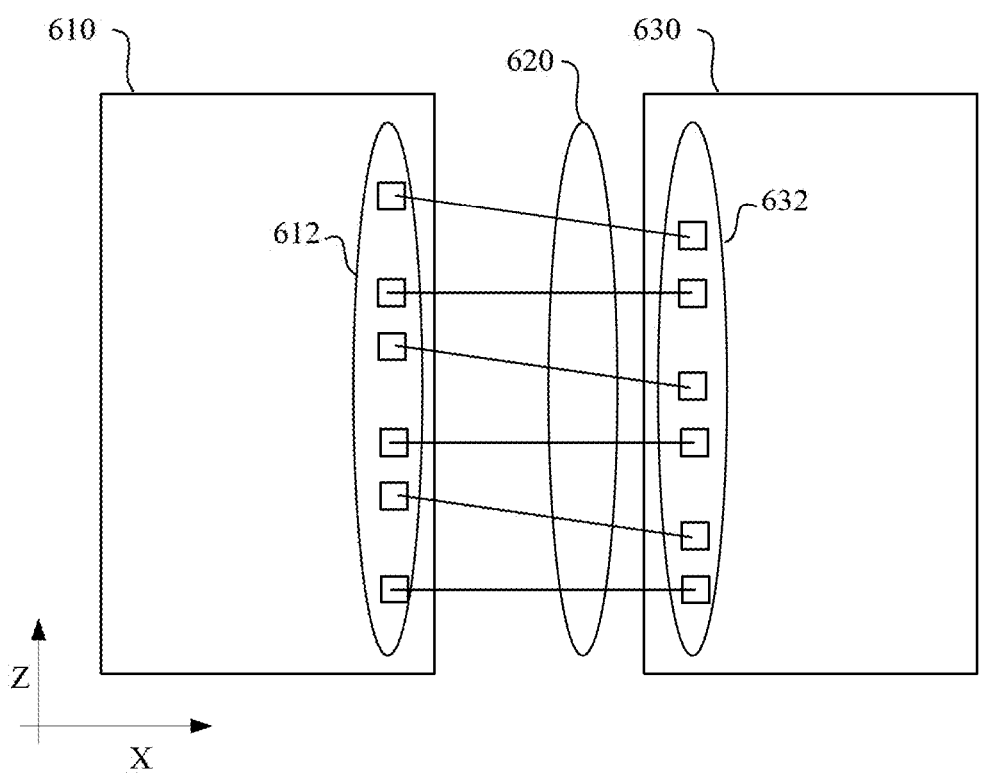
FIG. 6 shows a top view of two ICs connected with bond wires in a third arrangement, consistent with embodiments of the present disclosure.

FIG. 6 shows a top view of two ICs connected with bond wires in a third arrangement that is configured to increase effective distance of adjacent bond wires, consistent with embodiments of the present disclosure. Each of the first and second ICs, 610 and 630, include a respective set of bond pads, 612 and 632, which provide electrical connections to circuits of the ICs. Bond wires 620 connect respective bond pads 612 on the first IC 610 to respective bond pads 632 on the second IC 630. Bond pads 612 and 632 are arranged so the bond wires 620 are not oriented in parallel. For each adjacent pair of bond wires shown in FIG. 6, the bond wires are located closer together at one end of the bond wires and are located further away from each other at a second end of the bond wires. As a result, capacitance of an arrangement of adjacent bond wires is reduced relative to a parallel arrangement of adjacent bond wires.

Figure 7:
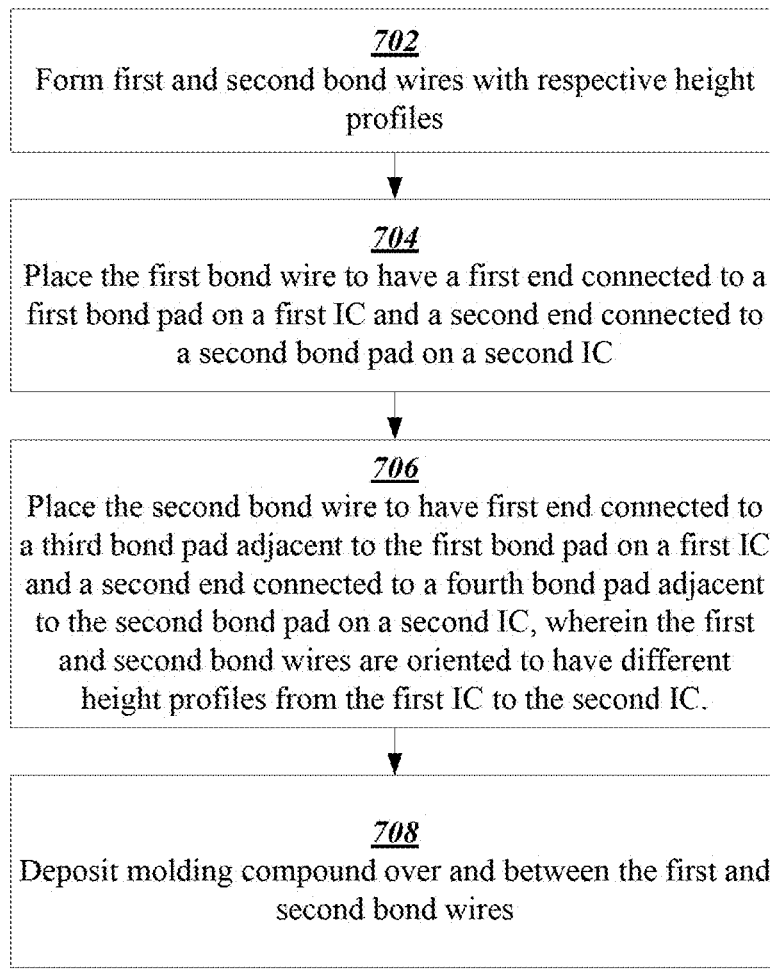
FIG. 7 shows a flowchart of a process for manufacture of a device for communication of differential signals between first and second ICs that mitigates parasitic capacitance between bond wires, in accordance with embodiments of the present disclosure.

In some embodiments, a method is provided for the manufacture of a device for communication of differential signals between first and second ICs that mitigates parasitic capacitance between bond wires. FIG. 7 shows a flowchart of a process for manufacture of a device for communication of differential signals between first and second ICs that mitigates parasitic capacitance between bond wires, in accordance with embodiments of the present disclosure. First and second bond wires are formed with respective height profiles at block 702. In some implementations, the first and second bond wires are formed with the same height profile and reoriented after formation to have different height profiles that are the reverse of one another, as discussed with reference to FIGS. 2 and 3.

At block 704, the first bond wire is placed to have a first end connected to a first bond pad on a first IC and a second end connected to a second bond pad on a second IC. At block 706, the second bond wire is placed to have a first end connected to a third bond pad adjacent to the first bond pad on a first IC and a second end connected to a fourth bond pad adjacent to the second bond pad on a second IC. The first and second bond wires are oriented to have different height profiles from the first IC to the second IC. Molding compound is deposited over and between the first and second bond wires at block 708. The molding compound provides support for the bond wires to ensure that the orientation of the bond wires is not inadvertently changed during manufacture, shipping, and use. In some embodiments, the molding compound is configured to have a low dielectric constant. Reducing the dielectric constant of the molding compound assists to reduce parasitic capacitance between the bond wires.

In some embodiments, parasitic capacitance between an adjacent pair of bond wires is mitigated by an inductor having a first end coupled to a first one of the pair of bond wires and a second end coupled to a second one of the pair of bond wires. FIG. 8 shows a system for bi-directional communication between two ICs having inductors connected to reduce mutual capacitance of bond wires, consistent with embodiments of the present disclosure.

Similar to the system shown in FIG. 1, the system shown in FIG. 8 includes first and second ICs 802 and 840, which are configured for bi-directional communication over bond wires 820, 822, 824, and 828. In this example, each of the bond wires capacitively couples IC 802 and IC 840. The IC 802 includes a transmitter circuit 804, that is configured to transmit differential signals over bond wires 820 and 822, and a receiver circuit 810 that is configured to receive differential signals transmitted over bond wires 824 and 828. Similarly, the second transceiver 840 includes a receiver circuit 842 that is configured to receive a differential signal transmitted over bond wires 820 and 822, and a transmitter circuit 850 that is configured to transmit signal data over bond wires 824 and 828.

The bond wires 820, 822, 824, and 828 are respectively coupled to bond pads 860, 861, 862 and 863 of IC 802 and are respectively coupled to bond pads 864, 865, 866, and 867 of IC 840. Isolation capacitors 806 and 808 are configured to capacitively connect transmitter circuit 806 to bond pads 860 and 861. Isolation capacitors 812 and 814 are configured to capacitively connect bond pads 862 and 863 to receiver circuit 810. Isolation capacitors 844 and 846 are configured to capacitively connect receiver circuit 842 to bond pads 864 and 865. Isolation capacitors 852 and 854 are configured to capacitively connect transmitter circuit 850 to bond pads 866 and 867.

A first inductor 870 is coupled to bond wires 820 and 822 (e.g., via bond pads 864 and 865), and is configured to mitigate parasitic capacitance 830 between the bond wires 820 and 822. Similarly, a second inductor 872 is coupled to bond wires 824 and 828 (e.g., via bond pads 866 and 867), and is configured to mitigate parasitic capacitance 836 between the bond wires 824 and 828. In some embodiments, inductance values of the first and second inductors 870 and 872 are selected based on parasitic capacitance, exhibited by the bond wires without the inductors and the frequency of differential signals to be transmitted over the bond wires. In some implementations, each of the inductors 870 and 872 has an inductance L, $$L \approx 1/[C^*(2\pi F)^2],$$

where F is the frequency of a differential signal transmitted over the bond wires and C is the mutual capacitance of the bond wires without the inductor connected. In some embodiments, the inductors are implemented on one or both of the ICs 802 and 840. In some other embodiments, the inductors are implemented external to the ICs 802 and 840.

In FIG. 8, the inductors 870 and 872 are coupled to respective pairs of the bond wires (820, 822, 824, and 828). In some embodiments, the inductors may be alternatively coupled to differential inputs of receiver circuits 810 and 842 and differential outputs of transmitter circuits 804 and 850.

Parasitic capacitances can also cause differential channels, provided by respective pairs of the bond wires, to become unbalanced. For instance, if adjacent bond wires are used to transmit respective differential signals in opposite directions, parasitic capacitance between the adjacent bond wires may cause the differential channels to become unbalanced. As a result of the imbalance, common mode immunity of the channels may become degraded. In some embodiments, the device for bi-directional communication between two ICs includes a balancing circuit that is configured to balance capacitances between the bond wires.

FIG. 9 shows a system for bi-directional communication between two ICs having capacitors connected in each of the ICs to reduce mutual capacitance of bond wires, consistent with embodiments of the present disclosure. Similar to the system shown in FIG. 1, the system shown in FIG. 9 includes first and second ICs 902 and 940 that are configured for bi-directional communication over bond wires 920, 922, 924, and 928. In this example, each of the bond wires capacitively couples IC 902 and IC 940. The IC 902 includes a transmitter circuit 904, which is configured to transmit differential signals over bond wires 920 and 922, and a receiver circuit 910, which is configured to receive differential signals that are transmitted over bond wires 924 and 928. Similarly, the second transceiver 940 includes a receiver circuit 942 that is configured to receive a differential signal transmitted over bond wires 920 and 922, and a transmitter circuit 950 that is configured to transmit signal data over bond wires 924 and 928.

The bond wires 920, 922, 924, and 928 are respectively coupled to bond pads 960, 961, 962, and 963 of IC 902 and respectively coupled to bond pads 964, 965, 966, and 967 of IC 940. Isolation capacitors 906 and 908 are configured to capacitively connect transmitter circuit 904 to bond pads 960 and 961. Isolation capacitors 912 and 914 are configured to capacitively connect bond pads 962 and 963 to receiver circuit 910. Isolation capacitors 944 and 946 are configured to capacitively connect receiver circuit 942 to bond pads 964 and 965. Isolation capacitors 952 and 954 are configured to capacitively connect transmitter circuit 950 to bond pads 966 and 967.

In this example, bond wires 920 and 922 provide a first communication channel for communicating differential signals from IC 902 to IC 940. Bond wires 924 and 928 provide a second communication channel for communicating differential signals from IC 940 to IC 902. Parasitic capacitance 932 between adjacent bond wires 922 and 924 causes the first and second communication channels to become unbalanced because bond wires 922 and 924 are subjected to greater capacitance than bond wires 920 and 928.

Balancing circuit (980 and 982) is configured to provide a capacitance between bond wires 920 and 928 that is substantially equal to a parasitic capacitance 932 between bond wires 922 and 924. In the implementation shown in FIG. 9, the balancing circuit includes a respective capacitor (e.g., 980 and 982) disposed on each of the ICs 902 and 940 and connected to the bond wires 920 and 928 in parallel (via bond pads 960, 963, 964, and 967). As such, each capacitor 980 and 982 has a capacitance that is approximately equal to half of the parasitic capacitance 932. In another implementation, the balancing circuit may be implemented by one capacitor having a capacitance approximately equal to the parasitic capacitance 932. The balancing circuit may be implemented on one or both of the ICs (902 and 940) or may be implemented external to the ICs. In some embodiments, balancing may alternatively or additionally be performed by a first capacitor coupled to nodes 990 and 992 and/or a second capacitor coupled to nodes 994 and 996.

Based upon the above discussion and illustrations, those skilled in the art will readily recognize that various modifications and changes may be made to the various embodiments without strictly following the exemplary embodiments and applications illustrated and described herein. For instance, various ones of the disclosed structures and techniques for reducing and or balancing parasitic capacitances may be combined in various combinations. Such modifications do not depart from the true spirit and scope of various aspects of the disclosure, including aspects set forth in the claims.

What is claimed is:

1. A device communicating using differential signaling and capacitive isolation between two integrated circuit chips, the device being subject to signal degradation from capacitance between bond wires connecting the two integrated circuit chips, the device comprising:
  a first integrated circuit chip including:
    a first differential signal driver circuit configured and arranged to transmit a first differential signal,
    a first isolation circuit configured and arranged to receive the first differential signal and to produce a second version of the first differential signal that is isolated from the first differential signal driver circuit, and
    a first pair of bond pads configured and arranged to receive the second version of the first differential signal;
  a second integrated circuit chip including:
    a second pair of bond pads configured and arranged to receive the second version of the first differential signal,
    a second isolation circuit configured and arranged to receive the second version of the first differential signal and to produce a third version of the first differential signal that is isolated from the second pair of bond pads, and
    a first differential signal receiver circuit configured and arranged to receive the third version of the first differential signal; and
  first and second bond wires that each form an electrical connection between a respective one of the first pair of bond pads and a respective one of the second pair of bond pads, the first and second bond wires specifically arranged such that a distance between the first and second bond wires varies by at least 10% as measured at two points along a length of the first bond wire.

2. The device of claim 1, wherein the first bond wire has a height profile between the first pair of bond pads and the second pair of bond pads that is different than a height profile of the second bond wire between the first pair of bond pads and the second pair of bond pads.

3. The device of claim 2, wherein:
  the first bond wire is positioned at a first height at a distance t, relative to a first end of the first bond wire; and
  the second bond wire is positioned at a second height at the distance t, relative to a first end of the second bond wire and along a length of the second bond wire, the first height being different from the second height.

4. The device of claim 2, wherein the first and second bond wires are positioned in respective parallel planes that are each perpendicular to a surface of the first integrated circuit chip.

5. The device of claim 1, wherein the length of the first bond wire is different than a length of the second bond wire.

6. The device of claim 1, wherein the length of the first bond wire is the same as a length of the second bond wire.

7. The device of claim 1, wherein
  bonds pads in the first pair of bond pad are separated by a distance that is less than 10 times a radius of the bond wires.

8. The device of claim 1, wherein:
  the first isolation circuit includes:
    a first isolation capacitor having a first plate coupled to a first output of the first differential signal driver circuit and a second plate coupled to a first one of the first pair of bond pads; and
    a second isolation capacitor having a first plate coupled to a second output of the first differential signal driver circuit and a second plate coupled to a second one of the first pair of bond pads; and
  the second isolation circuits includes:

a third isolation capacitor having a first plate coupled to a first input of the first differential signal receiver circuit and a second plate coupled to a first one of the second pair of bond pads; and a fourth isolation capacitor having a first plate coupled to a second input of the first differential signal receiver circuit and a second plate coupled to a second one of the second pair of bond pads.

9. The device of claim 8, wherein the first, second, third, and fourth isolation capacitors have respective capacitances less than 100 fF.

10. The device of claim 8, wherein the first, second, third, and fourth isolation capacitors each have a dielectric made of silicon oxide.

11. The device of claim 10, wherein the dielectric of the first, second, third, and fourth isolation capacitors is thicker than 4 µm.

12. The device of claim 1, wherein the first and second isolation circuits each comprise an inductor.

13. The device of claim 1, further comprising:
an inductor having a first end coupled to the first bond wire and a second end coupled to the second bond wire.

14. The device of claim 13, wherein:
the first differential signal is a differential signal having a frequency F;
the first and second bond wires have a mutual capacitance C; and
the inductor has an inductance L, where $L \approx 1/[C*(2\pi F)^2]$.

15. The device of claim 1, wherein:
the second integrated circuit chip further includes:
a second differential signal driver circuit configured and arranged to transmit a second differential signal;
a third isolation circuit configured and arranged to receive the second differential signal and to produce a second version of the second differential signal that is capacitively isolated from the second differential signal driver circuit; and
a third pair of bond pads configured and arranged to receive the second version of the second differential signal; and
the first integrated circuit chip further includes:
a fourth pair of bond pads configured and arranged to receive the second version of the second differential signal;
a fourth isolation circuit configured and arranged to receive the second version of the second differential signal and to produce a third version of the second differential signal that is capacitively isolated from the fourth pair of bond pads; and
a second differential signal receiver circuit configured and arranged to receive the third version of a second differential signal; and
third and fourth bond wires that each form an electrical connection between a respective one of the third pair of bond pads and a respective one of the fourth pair of bond pads, the third and fourth bond wires specifically arranged such that a distance between the third and fourth bond wires varies by at least 10% as measured at two points along a length of the third bond wire.

16. The device of claim 15, wherein:
the first integrated circuit chip further includes a first capacitor having a first terminal coupled to one of the first pair of bond pads and a second terminal coupled to a bond pad of the fourth pair of bond pads and a second capacitor having a first terminal coupled to one of the second pair of bond pads and a second terminal coupled to a bond pad of the third pair of bond pads.

17. A device, comprising:
a first integrated circuit (IC) including:
a first differential signal driver circuit;
a first differential receiver circuit;
first, second, third, and fourth bond pads;
a first isolation circuit configured and arranged to provide differential signals from first and second outputs of the first differential signal driver circuit to the first and second bond pads and provide isolation between the first differential signal driver circuit and the first and second bond pads; and
a second isolation circuit configured and arranged to provide differential signals from the third and fourth bond pads to first and second inputs of the first differential receiver circuit and provide isolation between the first differential receiver circuit and the third and fourth bond pads;
first, second, third, and fourth bond wires respectively coupled to the first, second, third, and fourth bond pads, the second bond wire being adjacent to the third bond wire;
a second IC including:
a second differential signal driver circuit;
a second differential receiver circuit;
fifth, sixth, seventh, and eighth bond pads respectively coupled to the first, second, third, and fourth bond pads;
a third isolation circuit configured and arranged to provide differential signals from the fifth and sixth bond pads to first and second inputs of the second differential receiver circuit and isolation between the second differential receiver circuit and the fifth and sixth bond pads; and
a fourth isolation circuit configured and arranged to provide differential signals from first and second outputs of the second differential signal driver circuit to the seventh and eights bond pads and provide isolation between the second differential signal driver circuit and the seventh and eighth bond pads; and
a balancing circuit, configured to provide a capacitance between the first and fourth bond wires that is substantially equal to the parasitic capacitance between the adjacent second and third bond wires.

18. The device of claim 17, wherein the balancing circuit includes a capacitor having a first plate coupled to the first bond wire and a second plate coupled to the fourth bond wire.

19. The device of claim 17, wherein each adjacent pair of the first, second, third, and fourth bond wires are specifically arranged such that a distance between the adjacent pair of bond wires varies by at least 10% as measured at two points along a length of one of the adjacent pair of bond wires.

20. A method of manufacturing a device that communicates differential signals between first and second integrated circuits (ICs), which operate in respective voltage domains, over a pair of bond wires, comprising:
manufacturing first and second bond wires of the pair of bond wires, each having a respective height profile extending between first and second ends of the bond wire;
placing the first bond wire to have a first end of the bond wire coupled to a first bond pad located on the first IC and a second end of the bond wire coupled to a second bond pad located on the second IC; and
placing the second bond wire to have a first end of the bond wire coupled to a third bond pad located on the first IC and a second end of the bond wire coupled to a fourth bond pad located on the second IC, wherein the first and second bond wires are oriented such that a distance between the first and second bond wires varies by at least 10% as measured at two points along a length of the first bond wire.

\* \* \* \* \*